United States Patent
Chang et al.

(10) Patent No.: US 6,765,242 B1
(45) Date of Patent: Jul. 20, 2004

(54) NPN DOUBLE HETEROSTRUCTURE BIPOLAR TRANSISTOR WITH INGAASN BASE REGION

(75) Inventors: Ping-Chih Chang, Albuquerque, NM (US); Albert G. Baca, Albuquerque, NM (US); Nein-Yi Li, Albuquerque, NM (US); Hong Q. Hou, Albuquerque, NM (US); Carol I. H. Ashby, Edgewood, NM (US)

(73) Assignees: Sandia Corporation, Albuquerque, NM (US); Emcore Corporation, Somerset, NJ (US)

( * ) Notice: Subject to any disclaimer, the term of this patent is extended or adjusted under 35 U.S.C. 154(b) by 356 days.

(21) Appl. No.: 09/547,152

(22) Filed: Apr. 11, 2000

(51) Int. Cl.[7] .................. H01L 31/072; H01L 31/109
(52) U.S. Cl. .................. 257/197; 257/198; 257/200; 257/201
(58) Field of Search .................. 257/198, 197, 257/200, 201

(56) References Cited

U.S. PATENT DOCUMENTS

| | | | |
|---|---|---|---|
| 5,641,975 A | * 6/1997 | Agarwal et al. | 257/76 |
| 5,689,123 A | 11/1997 | Major | 257/190 |
| 5,710,439 A | 1/1998 | Ohkubo | 257/85 |
| 5,756,375 A | 5/1998 | Celii | 438/94 |
| 5,798,539 A | * 8/1998 | Jorke | 257/197 |
| 5,904,549 A | 5/1999 | Sato | 438/478 |
| 5,985,025 A | 11/1999 | Celii | 117/85 |
| 6,031,256 A | * 2/2000 | Liu et al. | 257/198 |
| 6,147,371 A | * 11/2000 | Tanaka | 257/197 |
| 6,188,137 B1 | * 2/2001 | Yagura et al. | 257/769 |
| 6,274,889 B1 | * 8/2001 | Ota et al. | 257/77 |

FOREIGN PATENT DOCUMENTS

| | | | |
|---|---|---|---|
| JP | 405075095 A | * | 3/1993 |
| JP | 406037105a | * | 2/1994 |

OTHER PUBLICATIONS

M. Kondow et al., "GaInNAs: A Novel Material for Long–Wavelength–Range Laser Diodes with Excellent High–Temperature Performance," *Japenese Journal of Applied Physics*, vol. 35, pp. 1273–1275, 1996.

C.W. Tu, "Properties and Applications of a Novel Material System, III–N–V," *Electrochemical Society Proceedings*, vol. 99–4, pp. 250–259, 1999.

P.C. Chang, A.G. Baca, J.F. Klem, M.J. Hafich, C.I.H. Ashby, V.M. Hietala, "Comparison of InP/InGaAs HBT and InAlAs/InGaAj HBT for ULP Applications," *Electrochemical Society Proceedings*, vol. 99–17, pp. 177–184, 1999.

H.P. Xin, C.W. Tu and M. Geva, "Annealing Behavior of p–type $Ga_{0.892}In_{0.108}N_xAs_{1-x}$ ($0 \leq x \leq 0.024$) Grown by Gas–Source Molecular Beam Epitaxy," *Applied Physics Letters*, vol. 75, pp. 1416–1418, Sep. 6, 1999.

N.Y. Li, P.C. Chang, A.G. Baca, X.M. Xie, P.R. Sharps and H.Q. Hou, "DC Characteristics of MOVPE–Grown Npn InGaP/InGaAsN DHBTs," *Electronics Letters*, vol. 36, pp. 81–83, Jan. 6, 2000.

C.I.H. Ashby, K.R. Zavadil, A.G. Baca, P.C. Chang, B.E. Hammons and M.J. Hafich, "Metal–Sulfur–Based Air–Stable Passivation of GaAs with Very Low Surface–State Densities," *Applied Physics Letters*, vol. 76, pp. 327–329, Jan. 17, 2000.

* cited by examiner

Primary Examiner—Jerome Jackson
Assistant Examiner—Joseph Nguyen
(74) Attorney, Agent, or Firm—John P. Hohimer

(57) ABSTRACT

An NPN double heterostructure bipolar transistor (DHBT) is disclosed with a base region comprising a layer of p-type-doped indium gallium arsenide nitride (InGaAsN) sandwiched between n-type-doped collector and emitter regions. The use of InGaAsN for the base region lowers the transistor turn-on voltage, $V_{on}$, thereby reducing power dissipation within the device. The NPN transistor, which has applications for forming low-power electronic circuitry, is formed on a gallium arsenide (GaAs) substrate and can be fabricated at commercial GaAs foundries. Methods for fabricating the NPN transistor are also disclosed.

55 Claims, 9 Drawing Sheets

Section 1 - 1

Section 1 - 1

US 6,765,242 B1

NPN DOUBLE HETEROSTRUCTURE BIPOLAR TRANSISTOR WITH INGAASN BASE REGION

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to transistor structures and to methods for their fabrication, and in particular to an NPN double heterostructure bipolar transistor (DHBT) fabricated on a gallium arsenide (GaAs) substrate and having an indium gallium arsenide nitride (InGaAsN) base region.

BACKGROUND OF THE INVENTION

The growing market of portable electronic devices including cellular telephones demands high-performance electronic circuitry having minimal power dissipation to prolong battery life. Reducing the power dissipation of electronic circuitry requires transistors that operate with a small voltage swing. One approach that has been used to form heterostructure bipolar transistors (HBTs) having a low voltage swing has been to form a GaAs transistor having a strained indium gallium arsenide (InGaAs) base region, with the substrate being GaAs. A disadvantage of this approach is that the amount of indium that can be incorporated into the base region to lower the voltage swing is limited due to the formation of misfit dislocations as the InGaAs base becomes increasingly strained relative to the GaAs substrate.

Another approach that has been used is to form the HBT with a lattice-matched InGaAs base on an indium phosphide (InP) substrate so that more indium can be incorporated into the base region without the formation of misfit dislocations. This is the approach that is currently used for fabricating low-power HBTs. However, the unavailability of large-size (>4 inches in diameter) InP substrates and the relatively high cost of InP substrates compared to GaAs substrates makes production costs relatively high when using this approach so that its use has not become widespread in the consumer marketplace.

The present invention relates to an NPN double-heterostructure bipolar transistor (DHBT) which is based on the use of a p-doped indium gallium arsenide nitride (InGaAsN) layer for the base region. The collector region of the transistor can be formed of GaAs or InGaAsN; and the emitter region can be formed of indium gallium phosphide (InGaP), GaAs or aluminum gallium arsenide (AlGaAs).

An advantage of the present invention is that the transistor can be fabricated on GaAs substrates which are available in large sizes (4 to 6 inches in diameter) and at lower cost than alternative substrates (e.g. InP), thereby potentially reducing fabrication costs, and also allowing fabrication in commercial GaAs foundries.

Another advantage of the present invention is that the use of InGaAsN for the p-type base region of the NPN transistor can provide a reduced voltage swing, thereby reducing power dissipation in the transistor.

A further advantage of the present invention is that the structure of the transistor can be made substantially strain-free with the InGaAsN base region substantially lattice-matched to the GaAs substrate.

Yet another advantage of the present invention is that the transistor can operate up to very high frequencies on the order of 50 GHz or more.

These and other advantages of the method of the present invention will become evident to those skilled in the art.

SUMMARY OF THE INVENTION

The present invention relates to an NPN double-heterojunction bipolar transistor (DHBT) formed on a gallium arsenide (GaAs) substrate (e.g. a semi-insulating GaAs substrate). The transistor comprises a base region which further comprises a layer of p-type-doped indium gallium arsenide nitride (InGaAsN). An emitter region is located on one side of the base region and further comprises a layer of a first n-type-doped semiconductor having a bandgap energy greater than the bandgap energy of the InGaAsN base region. A collector region is located on the other side of the InGaAsN base region and further comprises a layer of a second n-type-doped semiconductor having a bandgap energy greater than or equal to the bandgap energy of the InGaAsN base region. Electrodes are provided on the NPN transistor to form separate electrical connections to each of the collector, emitter and base regions. The first n-type-doped semiconductor forming the emitter region can comprise GaAs, aluminum gallium arsenide (AlGaAs), or indium gallium phosphide (InGaP); and the second n-type-doped semiconductor forming the collector region can comprise GaAs or InGaAsN.

The InGaAsN base region comprises the semiconductor alloy composition $In_xGa_{1-x}As_{1-y}N_y$ with $0<x\leq 0.1$ and with $0<y\leq 0.03$. Alternately, the base region can comprise a compositionally-graded $In_xGa_{1-x}As_{1-y}N_y$ layer having $y<0.01$ near the emitter region and a larger value of $0.01\leq y\leq 0.03$ near the collector region. The p-type doping of the InGaAsN base region can also be varied in concentration across the base region with a higher level of the p-type-doping (e.g. $10^{19}$ cm$^{-3}$) being provided near the emitter region and with a lower level of the p-type doping (e.g. $10^{17}$ cm$^{-3}$) being provided near the collector region.

The NPN double-heterojunction bipolar transistor can further include a first bandgap-smoothing transition region (also termed herein a first transition region or a first transition layer) located between the base and collector regions. The first bandgap-smoothing transition region can comprise a layer of compositionally-graded indium gallium arsenide (InGaAs) or InGaAsN with n-type doping. In the case of an InGaAs first transition region, the semiconductor alloy composition of the InGaas can comprise $In_xGa_{1-x}As$ with x varying across the transition region from a low value of x (e.g. x<0.1) near the collector region to a higher value of x (e.g. $0.1\leq x\leq 0.4$) near the base region. In the case of an InGaAsN first transition region, the semiconductor alloy composition of the InGaAsN can comprise $In_xGa_{1-x}As_{1-y}N_y$ with x and y varying (i.e. stepped or graded in composition) from low values of x and y (e.g. x=0 and y=0) near the collector region to higher values of x and y (e.g. $x\geq 0.03$ and $y\geq 0.01$) near the base region. By appropriate epitaxial growth of the $In_xGa_{1-x}As_{1-y}N_y$ transition region (i.e. with x=3y), the first transition region can be formed substantially strain-free. The first transition region can further comprise a delta-doped portion (i.e. a sheet of n-type doping of, for example, $5\times 10^{12}$ cm$^{-2}$).

In some embodiments of the present invention, a second bandgap-smoothing transition region can be provided in the transistor between the base and emitter regions. This second bandgap-smoothing transition region with n-type doping can further include a delta-doped portion (e.g. a sheet of n-type doping of, for example, $5 \times 10^{12}$ cm$^{-2}$). When the emitter region comprises InGaP or AlGaAs, the second bandgap-smoothing transition region can comprise, for example, Al$_x$Ga$_{1-x}$As with x varying across the second bandgap-smoothing transition region from x=0 near the base region to a value of x that provides a bandgap energy substantially equal to that of the InGaP or AlGaAs emitter region.

A passivation layer can be provided on the transistor overlying exposed portions of the collector, emitter and base regions of the transistor to improve performance by reducing effects due to surface recombination. The passivation layer can comprise, for example, a layer of silicon oxynitride.

The present invention also relates to an NPN double-heterojunction bipolar transistor formed on a GaAs substrate and comprising a plurality of semiconductor layers epitaxially grown on the substrate, including a layer of GaAs with n-type doping forming a collector region of the transistor, a layer of indium gallium phosphide (InGaP) with n-type doping forming an emitter region of the transistor, and a layer of indium gallium arsenide nitride (InGaAsN) with p-type doping forming a base region which is sandwiched between the collector and emitter regions. Electrodes are provided on the transistor to separately contact each of the collector, emitter and base regions.

The collector region can include a relatively low n-type doping level (e.g. $10^{15}$–$10^{16}$ cm$^{-3}$) near the base region, and an increased doping level (e.g. $10^{18}$–$10^{19}$ cm$^{-3}$) away from the base region (i.e. to form a sub-collector region). The emitter region can insert further include a delta-doped portion (e.g. a sheet of doping of, for example, $5 \times 10^{12}$ cm$^{-2}$). The layer of InGaAsN forming the base region can be p-type doped, for example, in the range of $10^{18}$ to $10^{20}$ cm$^{-3}$.

The InGaAsN layer forming the base region 16 comprises In$_x$Ga$_{1-x}$As$_{1-y}$N$_y$ with an indium composition, x, given by $0 < x \leq 0.1$ and a nitrogen composition, y, given by $0 < y \leq 0.03$. To form a substantially-strain-free base region, the indium composition, x, is about three times the nitrogen composition, y. Thus, for example, when y=0.01 in the In$_x$Ga$_{1-x}$As$_{1-y}$N$_y$ base region, then x=0.03. In other embodiments of the present invention, the base region of the transistor can comprise In$_x$Ga$_{1-x}$As$_{1-y}$N$_y$ with x and y being varied (i.e. stepped or graded in composition) across the base region to provide a smaller value of y (e.g. y<0.01) near the emitter region and a larger value of y (e.g. $0.01 \leq y \leq 0.03$) near the collector region, thereby grading the semiconductor alloy composition of the base region. The p-type doping of the InGaAsN layer forming the base region can also be varied across the base region from a higher level of the p-type-doping on a side of the base region proximate to the emitter region to a lower level of the p-type doping being on the opposite side of the base region proximate to the collector region.

This transistor structure preferably further includes a first bandgap-smoothing transition region located between the base and collector regions. The first transition region can comprise a layer of compositionally-graded indium gallium arsenide (InGaAs) or InGaAsN. The first transition region can further comprise a delta-doped portion (e.g. a sheet of n-type doping of, for example, $5 \times 10^{12}$ cm$^{-2}$). A second bandgap-smoothing transition region (e.g. comprising a layer of compositionally-varying Al$_x$Ga$_{1-x}$ As with, for example, x=0 near the base region and graded in composition to x$\leq$0.3 near the emitter region can optionally be provided between the base and emitter regions. The second bandgap-smoothing transition region can further include a delta-doped portion.

The NPN transistor of the present invention can be formed with a mesa structure so that each of the collector, emitter and base regions can be independently contacted. To reduce surface recombination which can be detrimental to device performance, a passivation layer can be provided over exposed portions of the collector, emitter and base regions of the transistor. The passivation layer can comprise, for example, silicon oxynitride which can be deposited using a plasma (e.g. an electron-cyclotron resonance plasma).

The present invention further relates to an NPN double-heterojunction bipolar transistor that comprises a plurality of semiconductor layers epitaxially grown on a GaAs substrate, with the semiconductor layers being patterned to form a mesa structure for the transistor. The semiconductor layers in this embodiment of the present invention include a layer of n-type-doped GaAs grown on the substrate to form the collector region of the transistor; a first bandgap-smoothing transition region comprising a layer of n-type-doped compositionally-graded InGaAs or InGaAsN overlying the collector region; a layer of p-type-doped InGaAsN overlying the transition region to form the base region of the transistor; a layer of n-type-doped InGaP above the base region to form an emitter region of the transistor; a layer of n-type-doped GaAs forming a super-emitter region above the InGaP layer; and an n-type-doped InGaAs cap layer above the super-emitter region. Electrodes are provided to each of the collector, emitter and base regions of the transistor, with the electrical connection to the emitter region being formed on the cap layer. For high-speed operation, the substrate preferably comprises semi-insulating (S.I.) GaAs.

The first transition region in this embodiment of the present invention can further include a delta-doped portion (also termed herein a $\delta$-doped portion) to improve electron flow and to reduce a base-to-emitter voltage swing required to operate the transistor. Additionally, the emitter region can also include a delta-doped portion. Finally, the transistor can include a passivation layer (e.g. comprising silicon oxynitride) covering exposed portions of the collector, emitter and base regions of the transistor which can be formed as a mesa structure (e.g. a triple-mesa structure).

Additionally, the present invention relates to a method for forming an NPN double-heterojunction bipolar transistor, comprising steps for providing a GaAs substrate having a plurality of semiconductor layers epitaxially grown thereon; defining a structure for the transistor; and electrically contacting the collector, emitter and base regions. The semiconductor layers used to form the transistor include a layer of n-type-doped GaAs forming the collector region, a layer of n-type-doped InGaP forming the emitter region; and a layer of p-type-doped InGaAsN forming the base region, with the base region being sandwiched between the collector and emitter regions.

As described previously, the substrate can comprise a semi-insulating GaAs substrate; a first n-type-doped semiconductor layer (e.g. GaAs or InGaAsN) can be epitaxially grown to form the collector region of the transistor; and a second n-type-doped semiconductor layer (e.g. InGaP, GaAs, or AlGaAs) can be epitaxially grown to form the emitter region of the transistor. The base region is formed by epitaxially growing a layer of p-type-doped InGaAsN sandwiched between the collector and emitter regions.

The epitaxially-grown semiconductor layers can further include a first bandgap-smoothing transition region (e.g. comprising compositionally-graded InGaAs or InGaAsN) located between the collector and base regions, with the first transition region optionally including a delta-doped portion.

A delta-doped portion can also be provided in the emitter region, or alternately in a second bandgap-smoothing transition region (e.g. comprising compositionally-graded AlGaAs) which can be epitaxially grown between the emitter and base regions.

The step for defining the structure for the NPN transistor can comprise patterning the semiconductor layers to form a mesa structure, or alternately ion implanting the semiconductor layers to form a planar structure. The mesa structure can be formed, for example, by selectively etching the semiconductor layers with a wet etchant comprising phosphoric acid, hydrogen peroxide and water. The NPN transistor with its mesa structure can be passivated for improved performance by forming a passivation layer overlying exposed portions of the collector, emitter and base regions (e.g. by depositing a layer of silicon oxynitride over these exposed portions). The step for electrically contacting the collector, emitter and base regions can comprise forming a germanium/gold/nickel/gold contact or a palladium/germanium/gold contact for the collector, a tungsten silicide or a palladium/germanium/gold for the emitter, and a platinum/titanium/platinum/gold contact for the base.

Finally, the present invention relates to a method for forming an NPN double-heterojunction bipolar transistor on a GaAs substrate, comprising steps for epitaxially growing a plurality of semiconductor layers on the GaAs substrate including a first n-type-doped semiconductor layer (e.g. comprising GaAs or InGaAsN) forming a collector region of the transistor, a second n-type-doped semiconductor layer (e.g. comprising InGaP, GaAs or AlGaAs) forming an emitter region of the transistor, and a layer of p-type-doped InGaAsN forming the base region, with the base region being sandwiched between the collector and emitter regions; defining a structure for the transistor; and electrically contacting the collector, emitter and base regions.

The step for epitaxially growing the semiconductor layers preferably comprises epitaxially growing the semiconductor layers by metalorganic chemical vapor deposition (MOCVD), and can further include a step for epitaxially growing a first bandgap-smoothing transition region between the collector and base regions. The step for epitaxially growing the first transition region can comprise epitaxially growing a layer of InGaAs between the collector and base regions, with the InGaAs layer having the semiconductor alloy composition $In_xGa_{1-x}As$ with an indium composition, x, being graded from $x<0.1$ near the collector region to $0.1 \leq x \leq 0.4$ near the base region. Alternately, the step for epitaxially growing the first transition region can comprise epitaxially growing a layer of compositionally-graded $In_xGa_{1-x}As_{1-y}N_y$ with x and y varying across the first transition region from low values of x and y (e.g. x=0 and y=0) near the collector to higher values of x and y (e.g. $x \geq 0.03$ and $y \geq 0.01$) near the base region. Under appropriate growth conditions (i.e. with x=3y), the compositionally-graded $In_xGa_{1-x}As_{1-y}N_y$ first transition region can be formed substantially strain-free.

The process of growing the first transition region can also include delta-doping a portion thereof for further bandgap smoothing (i.e. for facilitating the flow of carriers across the device). Delta-doping can also be included in the epitaxial growth of the emitter region, or in an optional second bandgap-smoothing transition region located between the base and emitter regions. The second bandgap-smoothing transition region can be formed, for example, by epitaxially growing a layer of $Al_xGa_{1-x}As$ with x=0 near the base and with $x \leq 0.3$ near the emitter region.

As described previously, the NPN transistor of the present invention can be defined by etching the semiconductor layers to form a mesa structure. This etching step can be performed using a wet etchant comprising phosphoric acid, hydrogen peroxide and water. After the transistor structure has been defined, a further step can be provided for passivating the transistor by depositing a layer of silicon oxynitride over exposed portions of the collector, emitter and base regions of the transistor. This passivation step can be performed using an electron-cyclotron resonance (ECR) plasma to deposit the silicon oxynitride layer.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
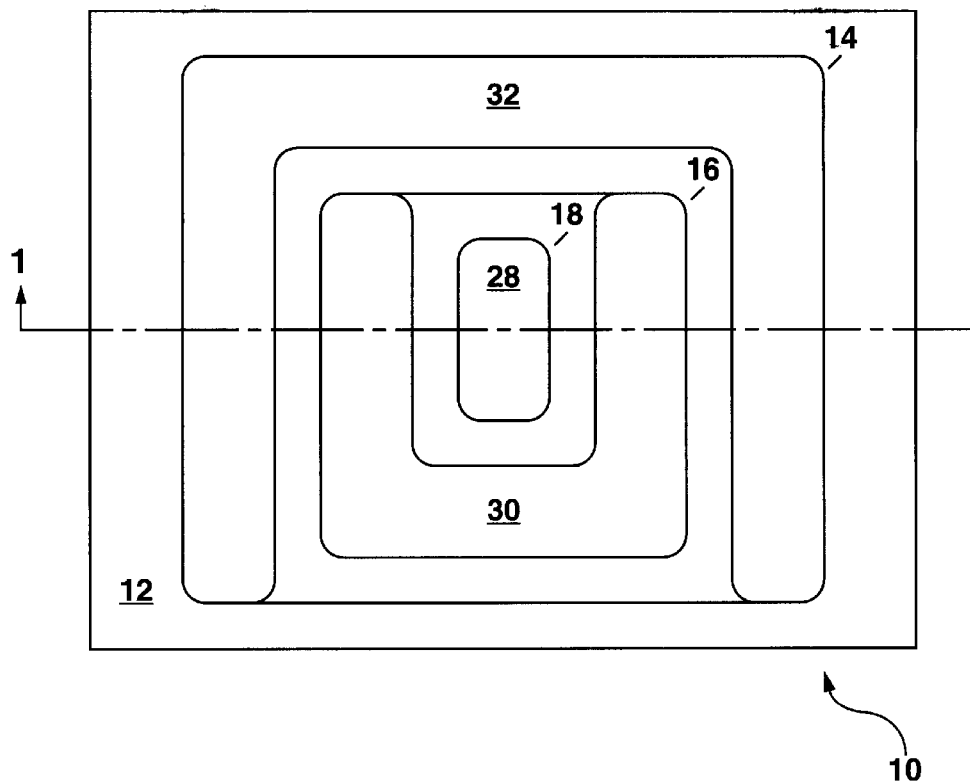
FIG. 1A shows a schematic plan view of an example of the NPN double-heterostructure bipolar transistor of the present invention.
Figure 1B:
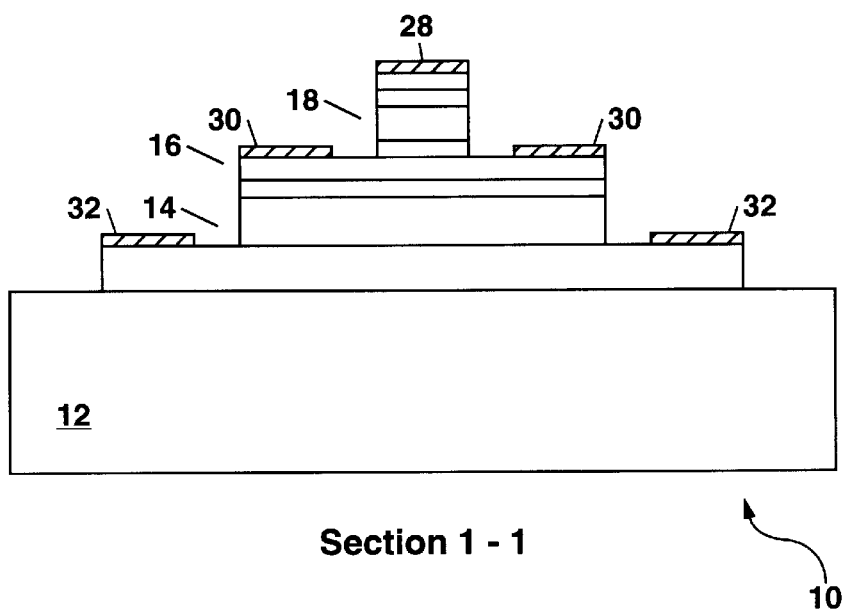
FIG. 1B shows a schematic cross-section view of the transistor of FIG. 1A along the section-line 1—1.

Referring to FIGS. 1A and 1B, there is shown schematically an example of the NPN double-heterostructure bipolar transistor 10 of the present invention. The transistor 10 is formed on a gallium arsenide (GaAs) substrate 12 and comprises a collector region 14 (also termed herein a collector layer or simply a collector), a base region 16 (also termed herein a base layer or simply a base), and an emitter region 18 (also termed herein an emitter layer or simply an emitter). The base region 16, which is sandwiched between the collector region 14 and the emitter region 18, comprises a layer of p-type-doped indium gallium arsenide nitride (InGaAsN). The collector region 14 comprises a layer of GaAs or indium gallium arsenide nitride (InGaAsN) with n-type doping to provide a bandgap energy for the collector region that is greater than or equal to the bandgap energy of the InGaAsN base region. The emitter region 18 is also n-type-doped and comprises a layer of indium gallium phosphide (InGaP) or GaAs or aluminum gallium arsenide (AlGaAs) to provide a bandgap energy for the emitter region that is greater than the bandgap energy of the InGaAsN base region 16.

The transistor 10 can be defined by forming a triple-mesa structure by etching down through the plurality of semiconductor layers to different depths for the collector region 14, the base region 16 and the emitter region 18. The mesa structure for the transistor allows each of the collector region 14, the base region 16 and the emitter region 18 to be separately electrically contacted. Electronic circuitry comprising a plurality of interconnected transistors 10 can be formed on a common substrate 12 (e.g. a semi-insulating GaAs substrate). Device isolation between the interconnected transistors 10 can be provided by the mesa structure in which the semiconductor layers are etched completely through down to the substrate 12 in an isolation region surrounding each transistor 10.

Alternately, the structure for the transistor 10 can be defined in part by implanting ions into the plurality of semiconductor layers. The implanted ions can be used to define electrically non-conducting regions over which a patterned metallization can pass to form electrical connections to the electrodes 28, 30 and 32. Etching through the various semiconductor layers would be used to form wells etched down through the semiconductor layers so that the electrodes 30 and 32 can be formed to the base and collector regions, respectively. Additionally, implanted ions can be used to form non-conducting regions (i.e. isolation regions) outside the transistor 10. The non-conducting regions can be formed by ion implanting hydrogen or oxygen ions into the semiconductor layers.

In FIGS. 1A and 1B, the substrate 12 comprises a monocrystalline GaAs wafer with a top surface oriented substantially along a <100> plane. The GaAs substrate 12 can be tilted slightly (e.g. up to 10°) off the <100> plane towards the <110> or <111A> planes of GaAs to facilitate epitaxial growth of the semiconductor layers thereon. The GaAs substrate 12 is generally semi-insulating to provide device isolation for reduced capacitance for device operation at high frequencies in the several-hundred-megaHertz to tens of gigaHertz range. However, for low-frequency operation, the GaAs substrate 12 can be n-type or p-type doped.

Table 1 shows an example of a layer structure that can be epitaxially grown to fabricate the transistor 10 of the present invention in an emitter-up configuration. This layer structure comprises a plurality of III–V compound semiconductor layers that can be epitaxially grown on a semi-insulating GaAs substrate 12 by metalorganic chemical vapor deposition (MOCVD).

TABLE 1

| Layer Type | Semiconductor Alloy Material | Layer Thickness (nm) | Growth Temperature (° C.) | Doping (cm$^{-3}$) |
|---|---|---|---|---|
| Cap Layer | n$^+$ In$_{0.5}$Ga$_{0.5}$As | 30 | 600 | 2 × 10$^{19}$ |
| Graded Contact Layer | n$^+$ Compositionally-Graded from GaAs to In$_{0.5}$Ga$_{0.5}$As | 30 | 600 | 2 × 10$^{19}$ |
| Super-Emitter | n$^+$ GaAs | 100 | 650 | 2 × 10$^{18}$ |
| Emitter | n InGaP | 50 | 650 | 7 × 10$^{17}$ |
| Base | p$^+$ InGaAsN | 70 | 600 | 1 × 10$^{19}$ |
| First Transition Region | n$^-$ Compositionally-Graded from GaAs to In$_{0.2}$Ga$_{0.8}$As | 30 | 600 | 3 × 10$^{16}$ |
| Collector | n$^-$ GaAs | 500 | 650 | 3 × 10$^{16}$ |
| Sub-Collector | n$^+$ GaAs | 500 | 650 | 5 × 10$^{18}$ |
| Substrate | Semi-Insulating GaAs | — | — | — |

For the MOCVD growth, an Emcore Corp., Model D180 turbodisk reactor was used, with the following source gases: trimethylindium (TMIn), trimethylgallium (TMGa), arsine (AsH$_3$), phosphine (PH$_3$), and dimethylhydrazine (DMHy). Hydrogen can be used as a carrier gas. For growth of the InGaAsN base region 16 a flow rate ratio of DMHy/(DMHy+AsH$_3$) was fixed at 0.95. The indium and nitrogen compositions of the epitaxially-grown layers were determined by the use of secondary ion mass spectroscopy (SIMS), photoluminescence and high-resolution x-ray diffraction measurements. The doping concentrations in the various layers were confirmed by polaron and Hall measurements.

In Table 1, the sub-collector layer can be considered to be a part of the collector region 14 since it is formed form the same semiconductor alloy except for a different doping level. The super-emitter layer is also considered herein to be a part of the emitter region 18. The layer structure of Table 1 also includes delta-doped portions in the first transition region and in the InGaP emitter layer, but this has been omitted from Table 1 for clarity and will be described in detail hereinafter.

In Table 1, the base layer 16 comprises p-type InGaAsN with the semiconductor alloy composition In$_{0.03}$Ga$_{0.97}$As$_{0.99}$N$_{0.01}$. This semiconductor alloy composition having three times as much indium (In) as nitrogen (N) is lattice-matched to GaAs so that the base region 16 is substantially strain-free. A bandgap energy for this InGaAsN composition is about 1.2 electron volts (eV).

In other embodiments of the present invention, the semiconductor alloy composition of the InGaAsN base region 16 can comprise In$_x$Ga$_{1-x}$As$_{1-y}$N$_y$ with values of x and y being selected to provide a particular bandgap energy to determine, at least in part, a turn-on voltage, $V_{on}$, for the transistor 10. Generally the values of x and y are related by x=3y to provide an In$_x$Ga$_{1-x}$As$_{1-y}$N$_y$ composition that is lattice-matched to the GaAs substrate 12. Also, increased values of x and y will provide a lower bandgap energy and hence a lower turn-on voltage, $V_{on}$, for the transistor 10. Thus, to form a transistor 10 having the lowest possible turn-on voltage, $V_{on}$, the values for x and y are preferably x≧0.03 and y≧0.01 subject to an ability to epitaxially grow semiconductor material of a particular composition with good quality. In other embodiments of the present invention, the base region 16 can comprise In$_x$Ga$_{1-x}$As$_{1-y}$N$_y$ with 0>x≦0.01 and with 0<y≦0.03.

In yet other embodiments of the present invention, the semiconductor alloy composition of the InGaAsN base region 16 can comprise $In_xGa_{1-x}As_{1-y}N_y$ with y being graded in composition from y<0.01 near the emitter region 18 to a larger value of $0.01 \leq y \leq 0.03$, and with x being substantially equal to three times y (i.e. x=3y) across the base region 16. In this way, the bandgap energy in the base region 16 can be varied to provide a higher bandgap energy near the emitter region 18 and a lower bandgap energy near the collector region 14, thereby improving minority carrier (i.e. electron) transport across the base region 16 to improve device performance.

In the example of Table 1, only two growth temperatures were used to epitaxially grow the layer structure used to fabricate the transistor 10 of the present invention. However, those skilled in the art will understand that the various semiconductor layers used to fabricate the transistor 10 can be grown over particular temperature ranges. Thus, GaAs, AlGaAs and InGaP layers can be grown by MOCVD at temperatures that are generally in the range of 600 to 750° C.; InGaAs layers can be grown by, MOCVD at temperatures that are generally in the range of 550 to 650° C.; and InGaAsN layers can be grown by MOCVD at temperatures that are generally in the range of 550 to 650° C.

In growing the layer structure in Table 1, the doping of the various n-type layers is indicated, with n⁻ signifying a level of doping below a nominal range (e.g. $10^{17}$–$10^{18}$ cm$^{-3}$) and n⁺ signifying a level of doping above the nominal level. The doping of the various n-type layers except for an InGaAs graded contact layer 20 and an InGaAs cap layer 22 can be performed using silicon (Si) as the n-type dopant using di-silane ($Si_2H_6$) as a dopant source. The collector region 14 generally has a relatively low n-type doping in the $10^{15}$–$10^{16}$ cm$^{-3}$ range near the base region 16, and an increased doping level of $10^{18}$–$10^{19}$ cm$^{-3}$ away from the base region (i.e. to form a sub-collector as shown in Table 1). The emitter region 18 can be doped generally in the range of $1 \times 10^{17}$ to $2 \times 10^{18}$ cm$^{-3}$ although a super-emitter layer can be doped to a slightly higher concentration (e.g. $5 \times 10^{18}$ cm$^{-3}$). The di-silane and other dopants are provided to the MOCVD reactor in a gaseous flow together with the hydrogen carrier gas and other source gases used to grow the individual semiconductor layers. For the InGaAs graded contact and cap layers 20 and 22, the n-type dopant tellurium (Te) can be used, with diethyltellurium (DETe) being the dopant source for providing the Te.

Carbon (C) from carbon tetrachloride ($CCl_4$) can be used as a p-type dopant for the InGaAsN base 16 for the transistor layer structure in Table 1, with the base region 16 generally being doped in the range of $10^{18}$–$10^{20}$ cm$^{-3}$. In some embodiments of the present invention, the doping in the base region 16 can be graded to improve minority carrier (i.e. electron) transport across the base region 16. This can be done, for example, by adjusting the flow of $CCl_4$ during epitaxial growth to provide for doping of the base region 16 at a lower concentration (e.g. $10^{18}$ cm$^{-3}$) near the collector region 14 and increasing the doping concentration of the base region (e.g. to $10^{19}$ cm$^{-3}$) near the emitter region 18. This spatially varying doping level across the base region 16 produces a built-in electric field that increases the transport of the minority carriers (i.e. electrons) across the base region 16.

Those skilled in the art will understand that other n-type and p-type dopants can be used, and that the dopants listed above (i.e. Si, Te and C) can be obtained from other dopant sources.

In Table 1, a first bandgap-smoothing transition region 24 is compositionally graded from GaAs (i.e. $In_xGa_{1-x}As$ with x=0) at an interface with the collector layer 14 to $In_{0.2}Ga_{0.8}As$ (i.e. $In_xGa_{1-x}As$ with x=0.2) at the interface with the InGaAsN base layer 16. The bandgap smoothing provided by the first transition region 24 reduces the effect of a heterojunction voltage at the interface between the collector and base regions 14 and 16 due to the different semiconductor materials used to form these regions.

In other embodiments of the present invention, the $In_xGa_{1-x}As$ first transition region 24 can be compositionally graded from $0 \leq x < 0.1$ up to a higher value of x in the range of 0.1 to 0.4 (i.e. $0.1 \leq x \leq 0.4$). Due to the small thickness (typically about 30 nm) of the region 24, any strain in the region 24 can generally be accommodated. The compositional grading of the first transition region 24 can be either uniform or stepped (i.e. discrete steps in composition during the epitaxial growth). The uniform compositional grading can be, for example, linear by controlling the flow rates of the various source gases (i.e. TMIn, TMGa and $AsH_3$) used to grow the first transition region 24. Similarly, a step-graded first transition region 24 can be formed by controlling the flow rates of these source gases in a stepped manner.

As an alternative, a step-graded first transition region 24 can be formed as a digital alloy (also termed a chirped superlattice) with a plurality of periods of alternating growth of GaAs and indium arsenide (InAs). In forming the digital alloy having a spatially averaged composition that is graded from GaAs to $In_{0.2}Ga_{0.8}As$, for example, an initial period of the digital alloy will contain more monolayers of GaAs than InAs (e.g. 20 monolayers of GaAs to 1 monolayer of InAs to provide an average composition $In_{0.05}Ga_{0.95}As$ for this initial period of the region 24). As the epitaxial growth progresses, the number of monolayers of GaAs will be reduced and the number of monolayers of InAs will be increased. A final period of the digital alloy having an average composition corresponding to $In_{0.2}Ga_{0.8}As$ can be formed, for example, with 20 monolayers of GaAs and 4 monolayers of InAs.

The first bandgap-smoothing transition region 24 in Table 1 further includes a delta-doped portion (also termed herein a δ-doped portion) to improve minority carrier flow in a conduction band of the transistor 10. The location of the δ-doped portion in the first transition region 24 can be, for example, 5 nanometers away from the InGaAsN base layer 16. The δ-doped portion comprises a sheet of n-type doping that can be formed by stopping epitaxial growth of the layers (i.e. by shutting off the various source gases used to grow the layers) and exposing a previously-grown portion of the first transition region 24 to a flow of di-silane and a hydrogen carrier gas. This dopes the exposed surface of the first transition region 24 with Si, incorporating the Si into the crystalline lattice structure of the first transition region 24 and thereby forming the δ-doped portion. The exact amount of n-type doping in the δ-doped portion will depend on the flow rate of di-silane, the time of exposure of the transition layer to the di-silane and the temperature to which the substrate 12 is heated. At a substrate temperature of 600° C. and with a 45 second exposure time, a sheet doping level of about $5 \times 10^{12}$ cm$^{-2}$ Si can be provided for the δ-doped portion. This sheet doping level used in the layer structure of Table 1 corresponds to much less than a monolayer so that the thickness of the first transition region 24 remains substantially unchanged.

Figure 6:
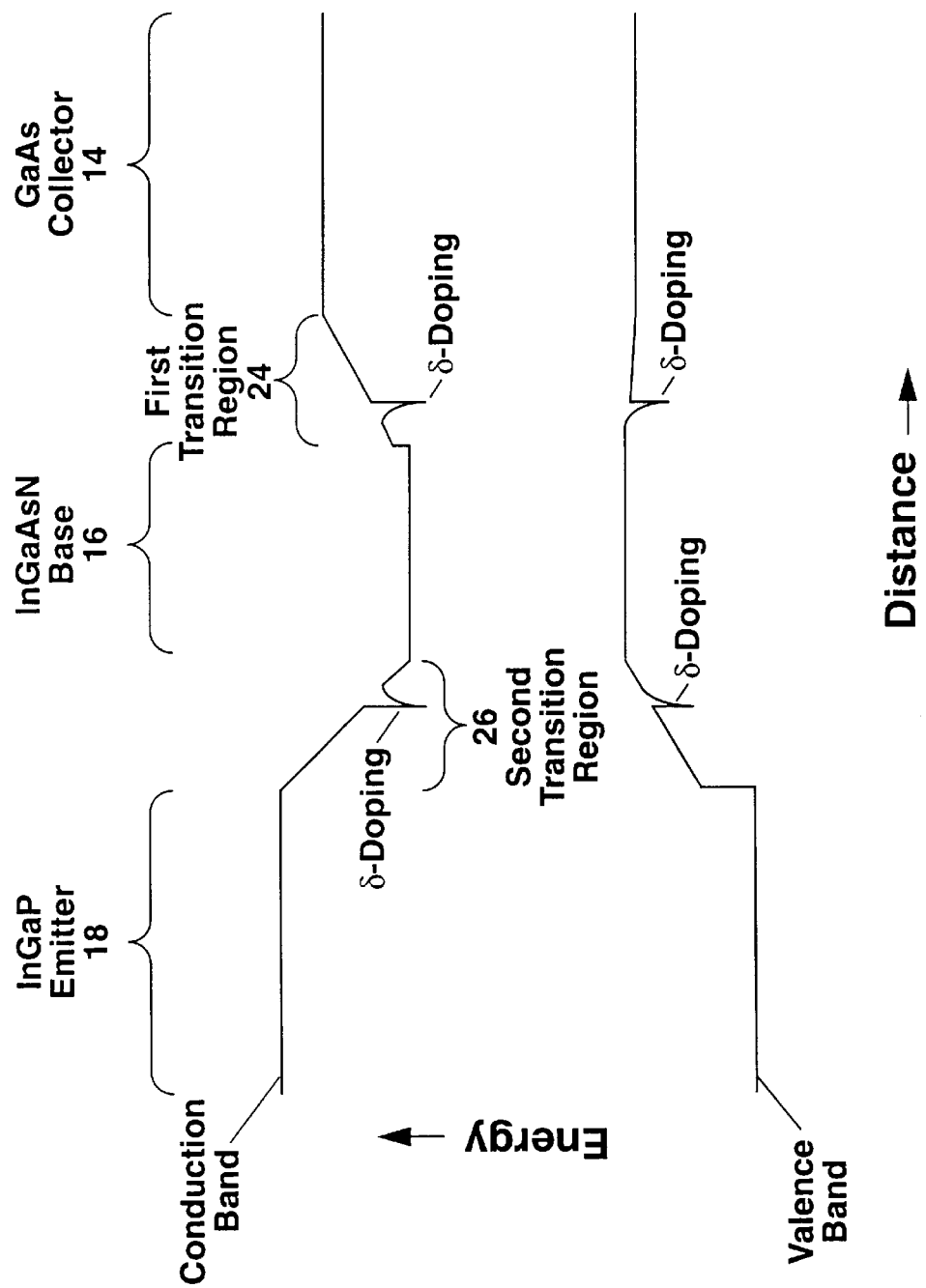
FIG. 6 shows a schematic energy band diagram for a second example of an NPN transistor according to the present invention.

A second δ-doped portion can be optionally formed in the InGaP emitter layer 18 and is present in the layer structure of Table 1. Alternately, the second δ-doped portion can be provided in a second bandgap-smoothing transition region 26 located between the base and emitter regions as shown in FIG. 6. This can be done by stopping the epitaxial growth after about 5 nanometers of the emitter layer 18 or the second transition region 26 has been epitaxially grown. The surface of the emitter layer 18 or second transition region 26 is then exposed to the di-silane under the same conditions listed above to produce a sheet doping level of, for example, about $5 \times 10^{12}$ cm$^{-2}$ Si to form the second δ-doped portion. After formation of the second δ-doped portion, growth of the InGaP emitter 18 or the second transition region 26 is resumed to grow the remainder of the layer 18 or region 26. The second δ-doped portion is useful for improving the minority carrier flow between the emitter and base layers 18 and 16.

The remaining layers in Table 1 can then be epitaxially grown above the InGaP emitter layer 18. A super-emitter layer comprising GaAs with a higher n-type doping than the InGaP emitter layer is epitaxially grown using the parameters listed in Table 1 and is considered herein to form a part of the emitter region 18. The graded contact layer 20 is then grown above the emitter region 18 starting with the semiconductor alloy composition GaAs and ending with the composition In$_5$Ga$_{0.5}$As. This graded contact layer 20, like the first transition region 24 can be either continuously graded or step-graded in composition, or alternately formed as a digital alloy. After epitaxial growth of the graded contact layer 20, a final cap layer 22 comprising In$_5$Ga$_{0.5}$As with a heavy n-type doping ($\geq 10^{19}$ cm$^{31\ 3}$) can be grown to complete the layer structure of the NPN transistor 10 in Table 1.

Those skilled in the art will understand that the order of epitaxial growth of the semiconductor layers in Table 1 can be reversed to form an emitter-down structure for the NPN transistor 10 of the present invention.

After the epitaxial growth is complete, the GaAs substrate 12 containing the plurality of semiconductor layers can be thermally annealed to improve the material quality of the InGaAsN base region 16. This can be done, for example, using a rapid thermal annealer (RTA) to heat the substrate 12 to a temperature of 650° C. for 4–75 minutes. The exact annealing time will depend upon the thickness of the InGaAsN base region 16, and on whether one or more additional layers of InGaAsN are provided (e.g. to form the first transition region 24 and/or to form the collector region 14). When these additional layers of InGaAsN are present, a longer annealing time will generally be required due to the increased amount of InGaAsN; whereas when only the base region 16 comprises InGaAsN, a shorter annealing time can generally be used. This annealing step is needed to improve the material quality of the epitaxially-grown InGaAsN.

Figure 2:
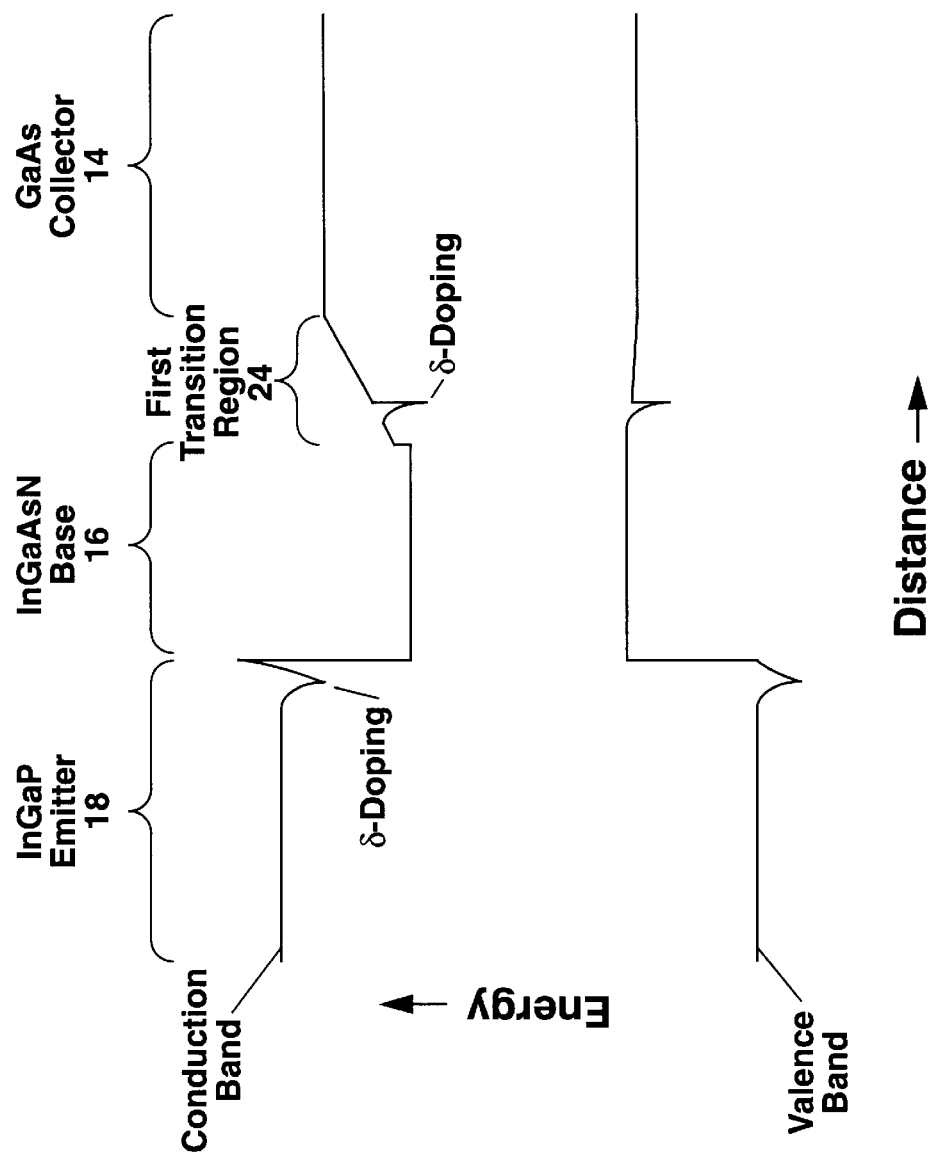
FIG. 2 shows a schematic energy band diagram for the transistor structure of Table 1.

FIG. 2 shows a schematic energy band diagram for the transistor layer structure of Table 1 incorporating a first δ-doped portion in the first transition region 24 and a second δ-doped portion in the emitter region 18. In the energy band diagram of FIG. 2, substantial conduction band offsets would occur at interfaces between the emitter and base and also between the base and collector without the first transition region 24 and the δ-doped portions. The conduction band offset in the emitter region 18 without the second δ-doped portion would impede electron flow through the base region of the transistor 10, thus requiring an increased base-to-emitter voltage (V$_{BE}$) which in turn would increase the turn-on voltage, V$_{on}$, for the transistor 10. The effect of not having the first transition region 24 and the first δ-doped portion therein would be to produce a current-blocking that would impede the flow of electrons from the base region 16 into the collector region 14 and lead to an increased carrier recombination within the base region 14 that would in turn substantially reduce a common emitter current gain, β. A larger collector voltage would then be required to reduce the current-blocking effect, but this would still lead to non-ideal current-voltage (I–V) characteristics. The effect of these conduction band offsets is lessened, however, by incorporating the first bandgap-smoothing transition region 24 between the base and collector regions. An optional second bandgap-smoothing transition region 26 can be provided between the base and emitter regions as shown in FIG. 6. Each transition region 24 or 26 has a graded bandgap energy due to grading of the semiconductor alloy composition across the width of the transition region. This graded bandgap energy improves transport in the conduction band and thereby improves performance of the NPN transistor 10 by reducing a turn-on voltage, V$_{on}$, and by increasing the current gain, β. Further beneficial effects for device performance can be achieved by providing δ-doping on one or both sides of the base region 16. The δ-doping produces localized bandbending as shown in FIGS. 2 and 6 which further reduces the conduction band offsets and/or improves the flow of electrons through the base region 16 to further improve device performance.

Returning to FIGS. 1A and 1B, the NPN double-heterostructure bipolar transistor 10 can be formed by patterning the various semiconductor layers in Table 1 to define the collector, base and emitter regions 14, 16 and 18, respectively. In the example of FIGS. 1A and 1B, the transistor 10 is shown with a triple-mesa structure (also termed herein a mesa structure) which can be formed using a series of masking and etching steps to selectively remove portions of the semiconductor layers to different depths to define the collector, base, and emitter regions 14, 16 and 18 and to isolate the transistor 10 from adjacent portions of the layers which can be used to form other transistors 10 on the same substrate 12.

A process for defining the structure of the transistor 10 will be described hereinafter with reference to FIGS. 3A–3F which show a series of semiconductor processing steps for defining a triple-mesa structure for the transistor 10. However, those skilled in the art will understand that there are other ways of defining the structure of the transistor 10 of the present invention (e.g. by using ion implantation to form a substantially planar structure for the transistor with the collector, base and emitter regions defined by a series of ion implantation steps as described previously).

Figure 3A:
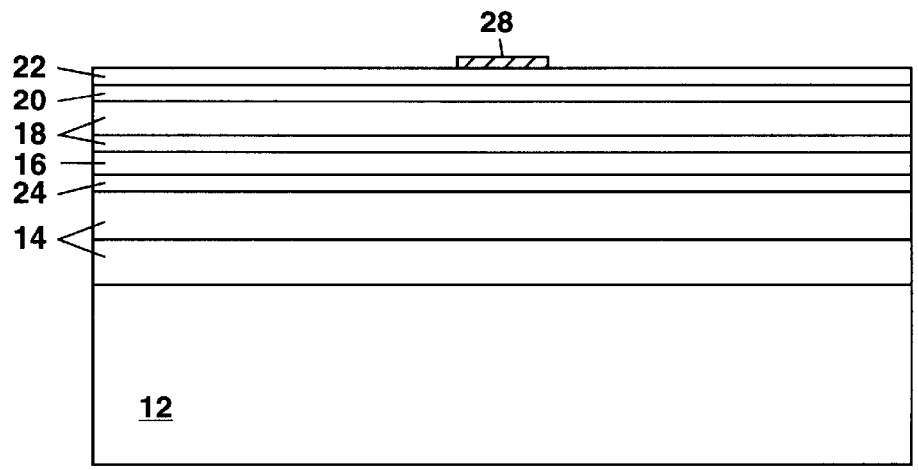
FIGS. 3A–3F show a series of processing steps for fabricating the transistor of FIGS. 1A and 1B.

In FIG. 3A, the GaAs substrate 12 containing the plurality of semiconductor layers (e.g. the layers of Table 1) can be initially patterned after epitaxial growth to form an emitter electrode 28 overlying a portion of the substrate 12 wherein the emitter region 18 is to be formed. The terms "patterned" and "patterning" as used herein refer to a sequence of well-known semiconductor processing steps including applying a photoresist to the substrate 12, prebaking the photoresist, aligning the substrate 12 with a photomask, exposing the photoresist through the photorriask, developing the photoresist, baking the photoresist, etching away the surfaces not protected by the photoresist, and stripping the protected areas of the photoresist so that further processing can take place.

In FIG. 3A, the emitter electrode 28 can comprise, for example, a layer of sputter-deposited tungsten silicide (WSi) patterned by dry etching (e.g. reactive ion etching) with a layer thickness of about 200 nanometers. Alternately, a Pd/Ge/Au emitter electrode 28 can be formed by evaporation or sputtering of layers of the metals palladium (Pd), germanium (Ge) and gold (Au) in that order to an overall layer thickness of about 200 nanometers. The exact shape of the emitter electrode 28 will depend upon particular operating characteristics to be obtained from the transistor 10. For example, for low-frequency or direct current (d.c.) operation, the emitter electrode 28, which is used to form a self-aligned emitter region 18, can be circular with a diameter of 50 μm. As another example, for high-speed operation above about 100 MHz, the emitter electrode 28 can be rectangular in shape as shown in FIG. 1A (e.g. with lateral dimensions of 3 μm×5 μm).

Figure 3B:
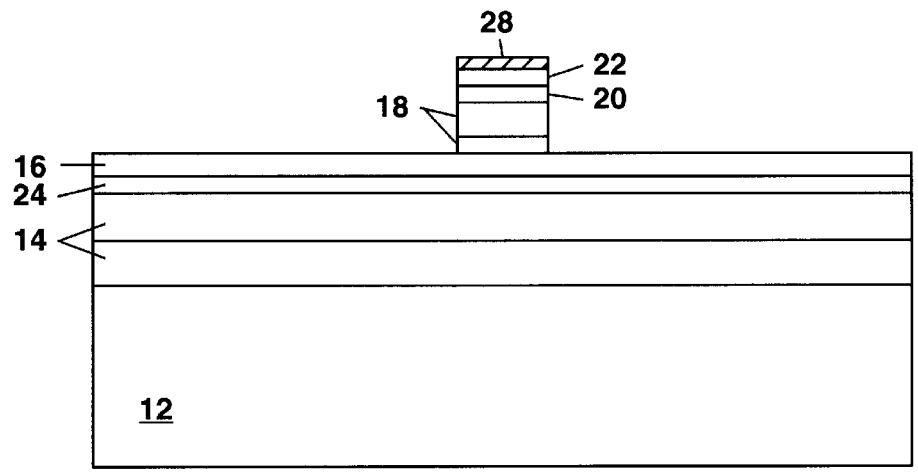

In FIG. 3B, the semiconductor layers 18, 20 and 22 are selectively removed everywhere except under the WSi emitter electrode 28 to form a first mesa which defines the emitter region 18. This can be done using a pair of etching steps. In a first etching step, a wet etchant comprising a solution of one part phosphoric acid ($H_3PO_4$) to four parts hydrogen peroxide ($H_2O_2$) and forty-five parts water ($H_2O$) can be used to etch down through the layers comprising InGaAs and GaAs (i.e. layers the cap layer 22, the graded contact layer 20 and the GaAs super-emitter). A second etching step can then used to etch down through the InGaP emitter layer 18 using a solution of hydrochloric acid (HCl) diluted with phosphoric acid to form the structure shown in FIG. 3B. Each etch step described herein can be timed to remove a predetermined amount of material. Although not shown in FIG. 3B, a slight undercutting of the semiconductor layers in the first mesa can occur due to isotropic etching by the wet etchants. Alternately, the mesa structure for the NPN transistor 10 can be dry etched using a plasma (e.g. comprising chlorine ions).

Figure 3C:
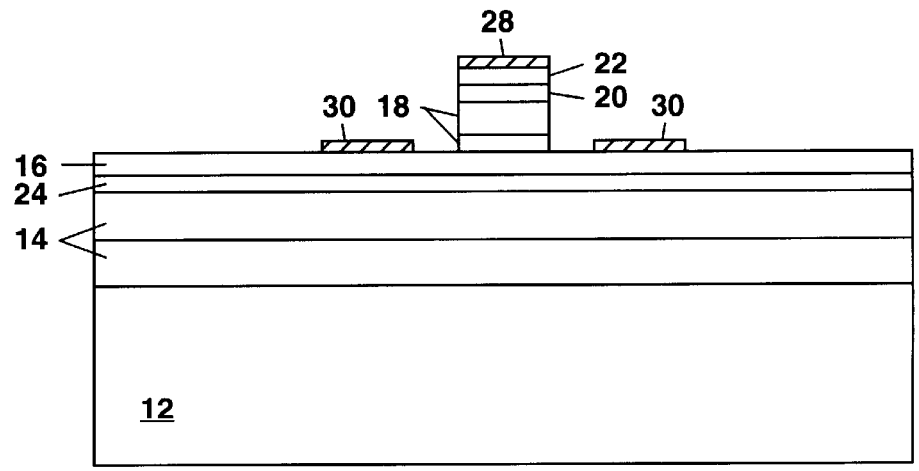

In FIG. 3C, a patterned base electrode 30 is formed overlying the base region 16 which is exposed by the etch steps in FIG. 3B. The base electrode 30 can comprise layers of platinum (Pt), titanium (Ti), Pt and gold (Au) deposited in that order by evaporation or sputtering, and patterned by lift-off to form a non-alloyed contact 30 having an overall thickness of about 60 nanometers. The base electrode 30 is generally annular or U-shaped (see FIG. 1A).

Figure 3D:
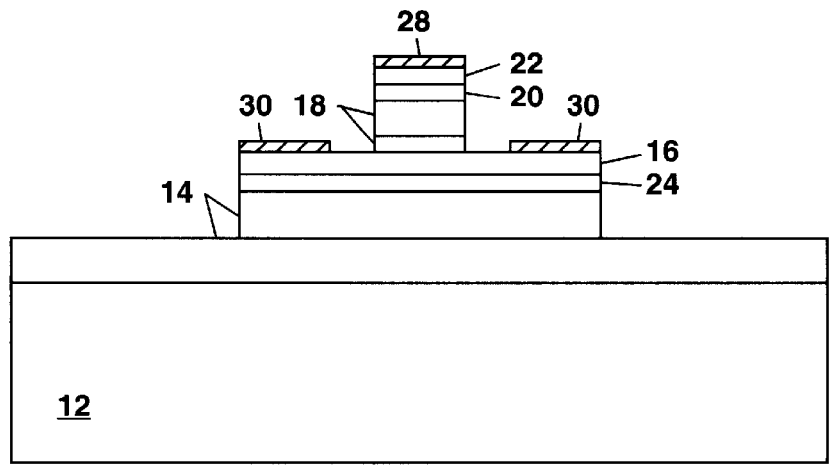

In FIG. 3D, the base region 16 is defined by etching down through the base layer 16, the first transition region 24 and halfway through the collector layer 14 (i.e. down to or slightly into the n+ GaAs sub-collector in Table 1) to form a second mesa. This etching step can be performed using the 1 $H_3PO_4$:4 $H_2O$:45 $H_2O$ etchant solution described previously with reference to FIG. 3B. An etch mask (e.g. comprising photoresist) can be formed over the base electrode 30, over exposed portions of the layers 18, 20 and 22 and over a portion of the layer 16 located within an outline of the base electrode 20. The etch mask (not shown) limits etching of the layers 16, 24 and 14 to a region outside the outline of the base electrode 30 and thereby forms the base region 16 of the transistor as shown in FIG. 3D.

Figure 3E:
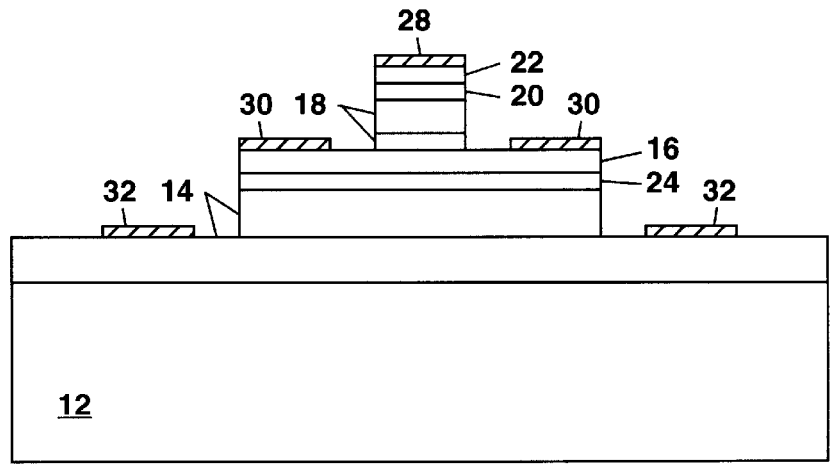

In FIG. 3E, a patterned collector electrode 32 is formed over an unetched portion of the collector region 14 (i.e. over the n+ GaAs sub-collector layer in Table 1). The collector electrode 32 can be, for example, a Pd/Ge/Au electrode 32 having an overall thickness of about 200 nanometers. After deposition, the Pd/Ge/Au collector electrode 32 can be patterned by lift-off to form an annular electrode 32, or a U-shaped electrode 32 which is generally oriented oppositely to the base electrode 30 as shown in FIG. 1A. As an alternative to the Pd/Ge/Au collector electrode 32, layers of Ge, Au, nickel (Ni) and Au can be deposited by evaporation or sputtering in that order to form a Ge/Au/Ni/Au electrode 32 to the collector region 14 with an overall thickness of generally about 200–300 nanometers.

A final etching step is used to etch through the remainder of the collector layer 14 (i.e. through the n+ GaAs sub-collector in Table 1) to form a third mesa. This etch step, which can be performed using the 1 $H_3PO_4$:4 $H_2O$:45 $H_2O$ etchant solution described previously with reference to FIG. 3B, serves to define an outer boundary or outline for the transistor 10, and to isolate the transistor 10 from other similar transistors 10 (not shown) which can be formed on the same GaAs substrate 12 using the same sequence of processing steps.

Figure 3F:
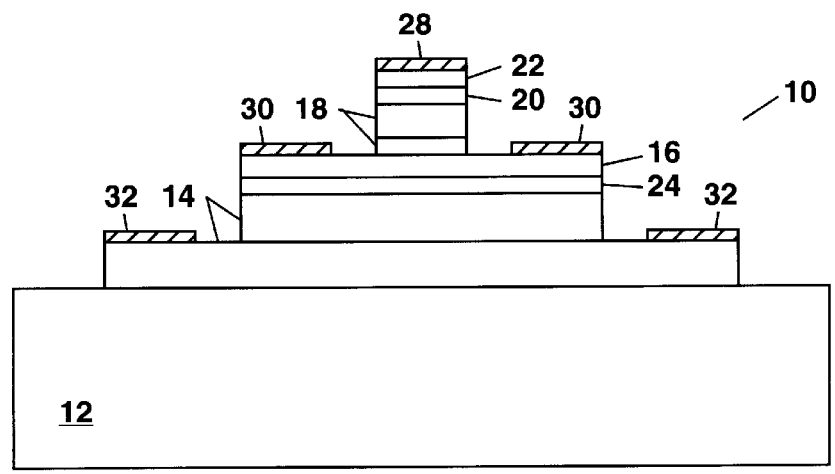

To complete formation of the electrodes 28, 30 and 32 an annealing step can be performed. When a Pd/Ge/Au electrode 28 is used for the emitter region 18, a low-temperature annealing step (e.g. at 175° C. for one hour) can be used to avoid metal diffusion (i.e. spiking) through the emitter region 18 to the base region 16. Alternately, when a WSi emitter electrode 28 is used, a rapid thermal annealing (RTA) step can be performed at a higher temperature (e.g. 360° C.) for a shorter time duration (e.g. 15 seconds) to anneal the various electrodes. The annealing step can be performed after completion of the device structure as shown in FIG. 3F.

Figure 4A:
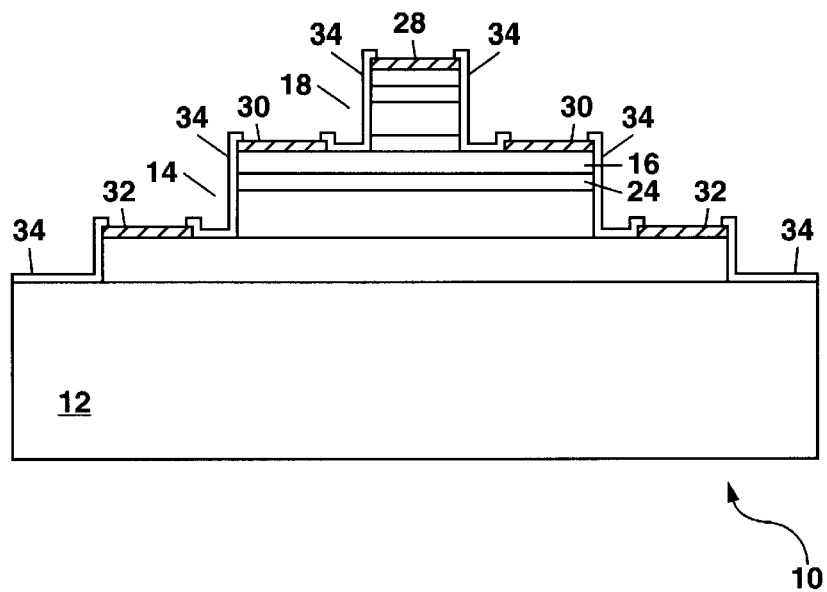
FIG. 4A shows a passivation layer applied to exposed surfaces of the NPN transistor to improve device performance by reducing surface recombination.

To reduce surface recombination and thereby improve device performance, an optional passivation layer 34 can be deposited over exposed portions of the collector, emitter and base regions of the transistor 10 as shown in FIG. 4A. The provision of a passivation layer 34 is especially important for transistors 10 having a small emitter region area for use at high frequencies (i.e. ≧100 MHz) since these devices have a relatively large perimeter-to-area ratio compared to devices fabricated for use at lower frequencies. The passivation layer 34 can comprise a 10 to 100 nanometer thick layer of silicon oxynitride ($SiO_xN_y$) conformally deposited using an electron-cyclotron resonance (ECR) plasma deposition system.

The ECR plasma deposition system uses microwaves to generate a high-density plasma from supplied source gases, and a magnetic field to keep electrons circulating in the plasma to produce a high electron density and to control beam collimation. No substrate heating is necessary for the ECR plasma deposition system; and a low substrate bias voltage of 0–100 volts can be used. Bias voltages in the low end of the above range (e.g. about 5 volts) are preferred to limit etch-back of the deposited silicon oxynitride passivation layer 34.

To form the silicon oxynitride passivation layer 34, the ECR system can be operated at a microwave power level of generally 80–400 W, and preferably at either 125 or 385 W, with the microwave frequency generally being 2.45 GHz. Source gases which can be used to form the silicon oxynitride passivation layer 34 include silane ($SiH_4$) and one or more of nitrogen ($N_2$), nitrous oxide ($N_2O$), or the combination of oxygen ($O_2$) and $N_2$. Argon (Ar) can additionally be added to the plasma.

The ECR high-density plasma can be operated at a pressure of typically 15–30 milliTorr, and preferably about 20 milliTorr. Flow rates for the source gases can be in the range of 5–50 standard-cubic-centimeters-per-minute (sccm) silane, 5–50 sccm of the nitrogen source gas (i.e. $N_2$, $N_2O$, or $N_2+O_2$), and 0–20 sccm argon. Preferred flow rates are 20 sccm silane, 30 sccm of the nitrogen source, and 4 sccm argon. A 5 volt bias can be provided to the GaAs substrate 12 with no substrate heating being necessary. The silicon oxynitride passivation layer 34 can be deposited in the ECR plasma at a rate of 5–150 nanometers/minute. The entire device 10 can be covered with a blanket-deposited conformal silicon oxynitride passivation layer 34; and a dry etching step (e.g. reactive ion etching) can be used to open vias through the silicon oxynitride to the electrodes 28, 30 and 32. The silicon oxynitride layer 34 formed in this manner can also contain some hydrogen which can be optionally removed by annealing (e.g. by performing the RTA step for annealing the electrodes after deposition of the silicon oxynitride passivation layer 34).

Figure 4B:
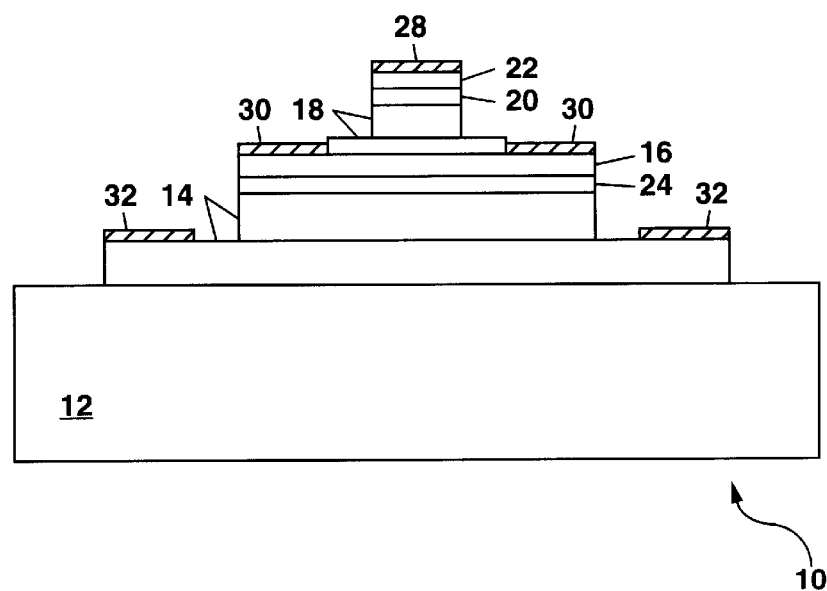
FIG. 4B shows an alternative method for reducing surface recombination by leaving an upper surface of the base region covered.

As an alternative to use of the passivation layer 34 for reducing surface recombination in the transistor 10, exposure of the base region 16 can be minimized since this is where the majority of the surface recombination occurs. This can be done for example, by etching only partially through the emitter layer 18 in forming the first mesa as shown in FIG. 4B so that an upper surface of the base region 16 remains covered within a region outlined by the base electrode 30. To leave the base layer 16 covered in this region, the HCl etch step can be omitted or shortened in time so that the InGaP emitter layer is unetched or only partially etched, and only the n$^+$ GaAs super-emitter layer of Table 1 is completely etched through. The omitted or shortened HCl etch step can then be used in forming the second mesa since it is then necessary to etch completely through the InGaP emitter layer in a region outside the outline of the base electrode 30.

Figure 5:
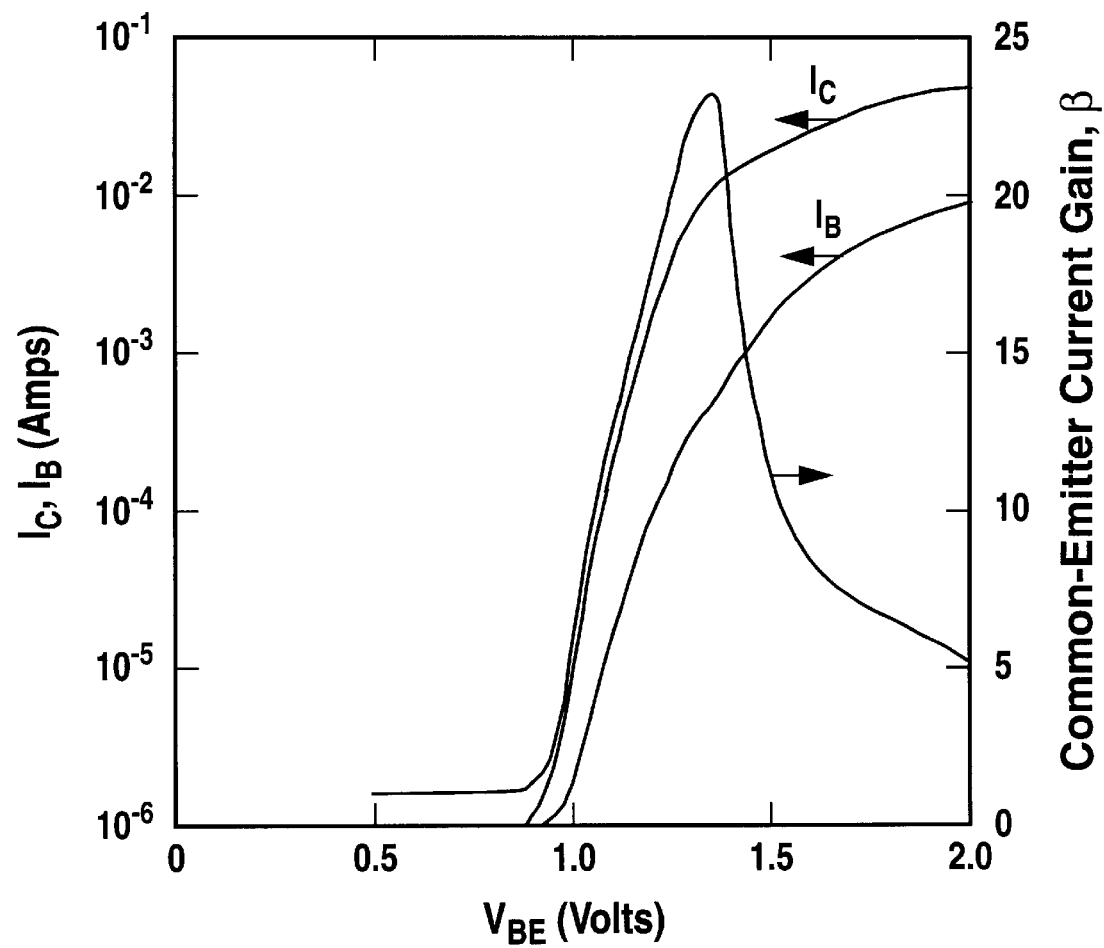
FIG. 5 shows a Gummel plot for an NPN transistor formed according to the present invention with a $3 \mu m \times 5 \mu m$ self-aligned emitter region and further including a passivation layer.

FIG. 5 shows a measured Gummel plot for the example of the NPN transistor 10 in FIG. 1 using the layer structure of Table 1 with the InGaAsN base region 16 comprising $In_{0.03}Ga_{0.97}As_{0.99}N_{0.01}$, and further including δ-doped portions in the first transition region 24 and in the emitter region 18. The NPN transistor 10 measured in FIG. 5 has a 3 μm×5 μm self-aligned emitter region 18, and further includes a silicon oxynitride passivation layer 34. The Gummel plot was measured with a semiconductor parameter analyzer (Hewlett-Packard Corp., Model 4145) for d.c. operation of the transistor 10. In FIG. 5, the transistor 10 has a peak value of β23 for the common-emitter current gain at a base-to-collector voltage, $V_{BC}$=0 volts. Additionally, the transistor 10 has a turn-on voltage, $V_{on}$32 0.89 volts which is advantageous for use in forming low-power electronic circuitry. The turn-on voltage, $V_{on}$, is defined herein as the value of a base-to-emitter bias voltage, $V_{BE}$, of the transistor 10 for which a collector current, $I_C$, in the transistor 10 reaches 1 μA.

Further improvements in device performance can be realized by further reducing impediments to minority carrier (i.e. electron) transport within the transistor 10. This can be done as described previously by adding a second bandgap-smoothing transition region 26 between the base and emitter regions 16 and 18 as shown in a schematic energy band diagram of a second example of the NPN transistor 10 of the present invention in FIG. 6. The second transition region 26 can be formed as described previously (e.g. using compositionally-graded AlGaAs) and can further include an optional second δ-doped portion. Alternately, a second δ-doped portion can be provided in the emitter region 18. The remaining semiconductor layers in the structure of the transistor 10 in FIG. 6 can be, for example, as listed in Table 1 and as described in detail herebefore.

Figure 7:
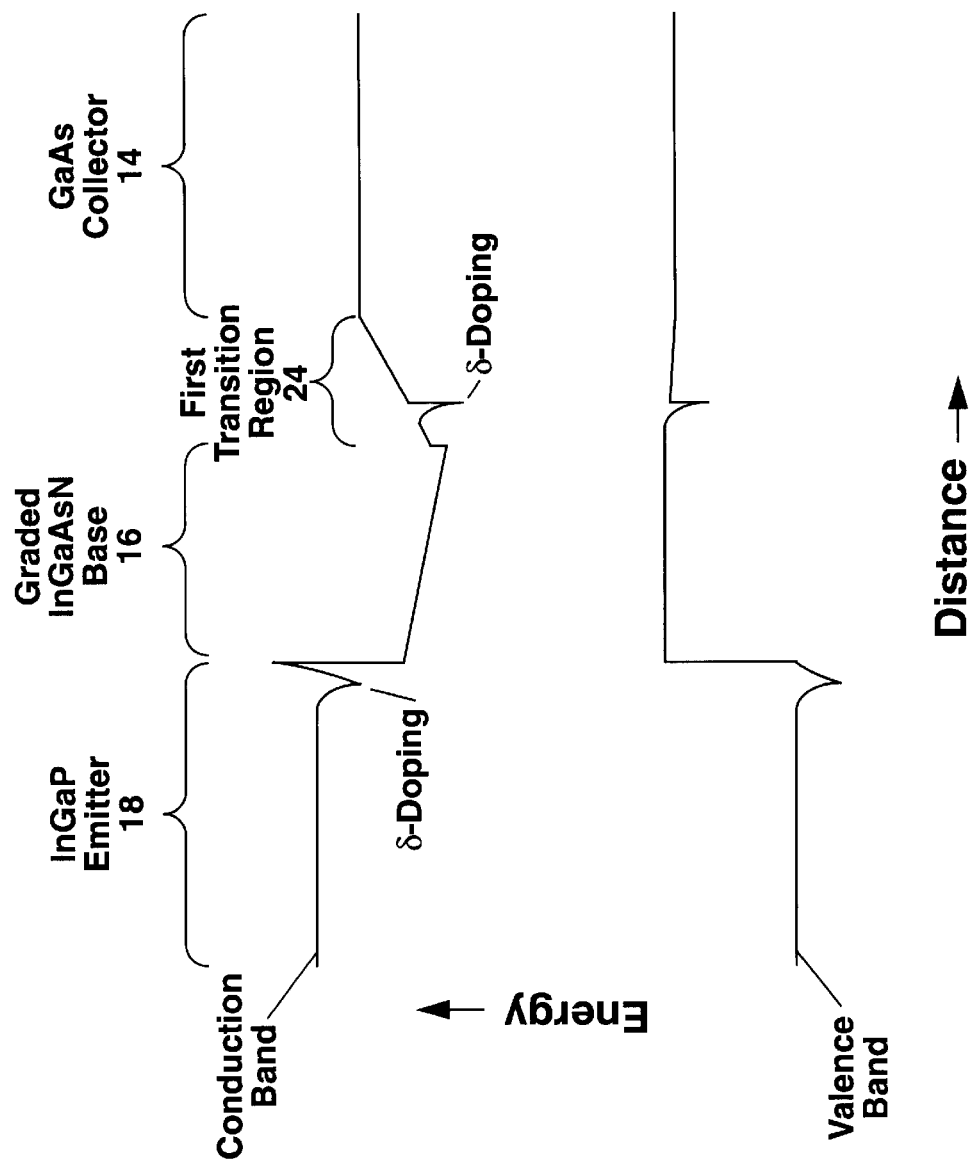
FIG. 7 shows a schematic energy band diagram for a third example of an NPN transistor according to the present invention.

Another way of reducing impediments to minority carrier flow in the base region 16 is to compositionally grade the base region 16 and/or to grade the p-type doping concentration across the base region 16 as described previously. A third example of the NPN transistor 10 of the present invention incorporating a compositionally-graded base region 16 is shown schematically in the energy band diagram FIG. 7. Here, the bandgap energy of the base region 16 is tailored to be largest near the emitter region 18 and to decrease towards the collector region 14. This tailored bandgap energy profile can be achieved, for example, by varying the composition of the $In_xGa_{1-x}As_{1-y}N_y$ base region 16 from x=0.03 and y=0.01 near the emitter region 18 to x=0 and y=0 near the collector region 14. The provision of a graded base region 16 can improve minority carrier transport across the base region 16, thereby reducing the surface recombination which, in turn, reduces the turn-on voltage, $V_{on}$.

Other embodiments of the NPN transistor 10 can be formed using a combination of one or more of the first bandgap-smoothing transition region 24, the second bandgap-smoothing transition region 26, the compositionally-graded base region 16 and the graded-p-type-dopant-concentration base region 16. In yet other embodiments of the present invention, the turn-on voltage, $V_{on}$, can be further reduced by increasing the nitrogen (N) composition, y, of the $In_xGa_{1-x}As_{1-y}N_y$ base region 16 to 0.01<y≦0.03 with the indium composition, x, being correspondingly increased to be about three times the nitrogen composition (i.e. x=3y) for a substantially strain-free base region 16.

Figure 8:
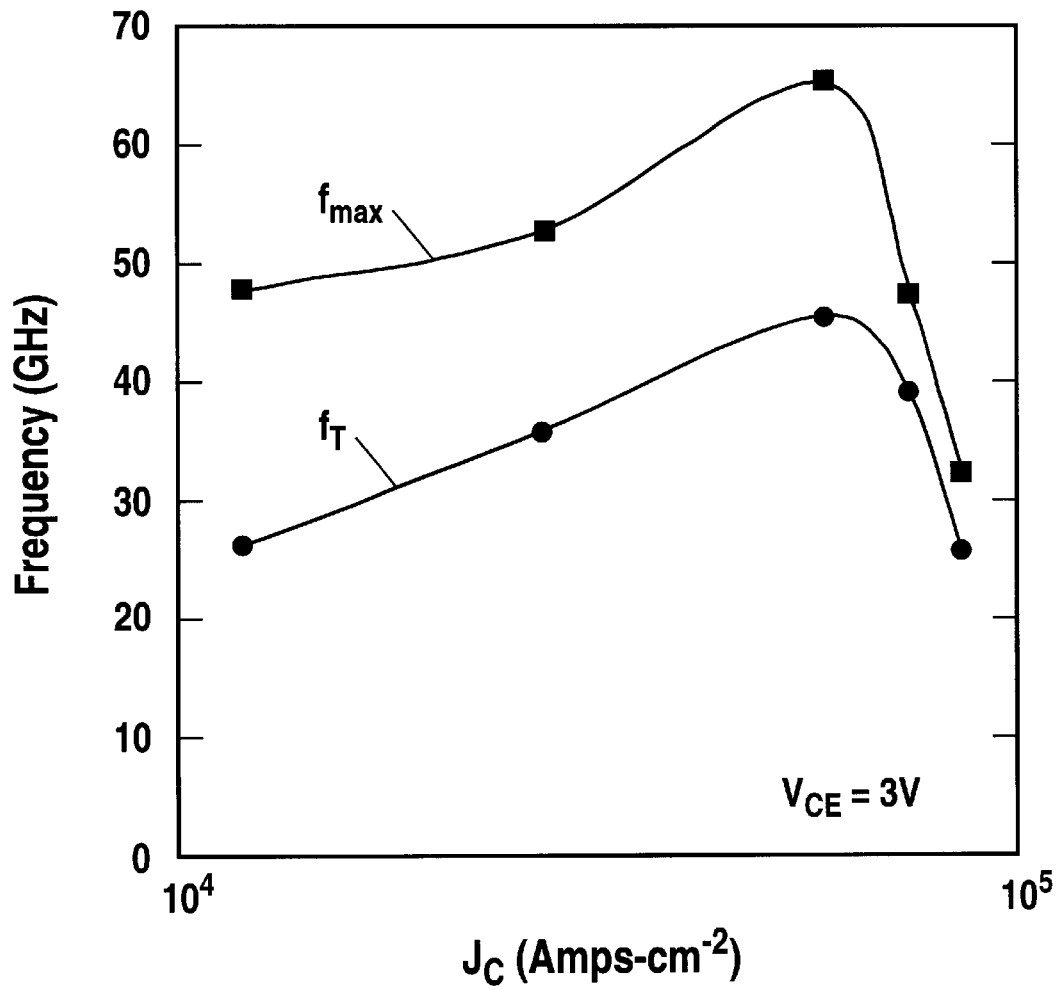
FIG. 8 shows frequency response characteristics for the transistor of FIG. 5.

FIG. 8 shows frequency response characteristics for the transistor 10 of FIG. 5. The frequency response curves in FIG. 8 were obtained from a two-port S-parameter measurement using a network analyzer (Hewlett-Packard Corp., Model HP-8510). Measured data points at various values of a collector current density, $J_C$, are indicated by the solid squares and circles in FIG. 8, with the solid-line curves being drawn to connect the measured data points. In FIG. 8, the transistor 10 has a peak value of a cutoff frequency, $f_T$, of 46 GHz, and a peak value of a maximum operating frequency, $f_{max}$, of 65 GHz. The cutoff frequency, $f_T$, is defined herein as the frequency for which the current gain, β, is unity.

Other embodiments of the present invention can also be formed by substituting an n-type-doped GaAs or AlGaAs layer for the InGaP emitter layer in Table 1. Each of the semiconductor alloys GaAs and AlGaAs are suited for use in forming the emitter region 18 since these semiconductor materials have a bandgap energy greater than that of the InGaAsN base region 16. These GaAs or AlGaAs layers for the emitter can be grown by MOCVD at the same temperature (650° C.) and doping levels $7×10^{17}–2×10^{18}$ cm-3) shown for the InGaP emitter layer and the GaAs super-emitter layer in Table 1, and with the same layer thickness (150 nm) as shown in Table 1 for the combined emitter and super-emitter layers.

Other embodiments of the present invention can also be formed by substituting a layer of n-type-doped InGaAsN for the n⁻ GaAs collector layer in Table 1. The semiconductor alloy composition of the InGaAsN collector layer can be the same as that of the InGaAsN base region 16. In this case, the compositionally-graded first transition layer 24 in FIG. 2 can be moved from being adjacent to the base region 16 to being located between the InGaAsN collector layer and an n⁺ GaAs sub-collector layer as shown in Table 1. The need for the first transition layer 24 can be eliminated if the InGaAsN collector layer is graded in semiconductor alloy composition (e.g. from a composition equal to that of the base region 16 to the composition $In_xGa_{1-x}As_{1-y}N_y$ with x=0 and y=0 which is equivalent to GaAs). This effectively combines the functionality of the first transition layer 24 into the InGaAsN collector layer. The InGaAsN collector layer can be epitaxially grown at about 550–650° C., and preferably at 600° C. The layer thickness and n-type doping level for the InGaAsN collector layer can be, for example, as shown for the n⁻ GaAs collector layer in Table 1. In some cases, material issues associated with the epitaxial growth of n-type InGaAsN can require that the n-type doping concentration in the InGaAsN collector layer be increased to mid-$10^{16}$–$10^{17}$ cm$^{-3}$.

The matter set forth in the foregoing description and accompanying drawings is offered by way of illustration only and not as a limitation. Other applications and variations of the apparatus and method of the present invention will become evident to those skilled in the art. Those skilled in the art will understand that the semiconductor layer structure of the NPN transistor 10 of the present invention can also be epitaxially grown by molecular beam epitaxy (MBE). The actual scope of the invention is intended to be defined in the following claims when viewed in their proper perspective based on the prior art.

What is claimed is:

1. An NPN double-heterojunction bipolar transistor formed on a gallium arsenide (GaAs) substrate and comprising:
   (a) a base region further comprising a layer of p-type-doped indium gallium arsenide nitride (InGaAsN);
   (b) an emitter region located on one side of the base region and further comprising a layer of a first n-type-doped semiconductor having a bandgap energy greater than the bandgap energy of the InGaAsN base region;
   (c) a collector region located on the other side of the base region and further comprising a layer of a second n-type-doped semiconductor having a bandgap energy greater than or equal to the bandgap energy of the InGaAsN base region; and
   (d) electrodes forming separate electrical connections to each of the collector, emitter and base regions of the transistor.

2. The transistor of claim 1 wherein the substrate comprises semi-insulating GaAs.

3. The transistor of claim 1 wherein the InGaAsN base region comprises
   $In_xGa_{1-x}As_{1-y}N_y$, with $0<x\leq0.1$ and with $0<y\leq0.03$.

4. The transistor of claim 1 wherein the InGaAsN base region comprises
   $In_xGa_{1-x}As_{1-y}N_y$, with $0<x\leq0.03$ and with $0<y\leq0.01$.

5. The transistor of claim 1 wherein the InGaAsN base region comprises
   $In_xGa_{1-x}As_{1-y}N_y$, with x and y being varied across the base region to provide a smaller value of $y<0.01$ near the emitter region and a larger value of $0.01\leq y\leq0.03$ near the collector region, thereby grading the composition of the base region.

6. The transistor of claim 1 wherein the p-type doping of the InGaAsN base region varies in concentration across the base region with a higher level of the p-type-doping proximate to the emitter region and with a lower level of the p-type doping proximate to the collector region.

7. The transistor of claim 1 further including a first bandgap-smoothing transition region located between the base and collector regions.

8. The transistor of claim 7 wherein the first bandgap-smoothing transition region further includes a delta-doped portion.

9. The transistor of claim 8 wherein the emitter region further includes a delta-doped portion.

10. The transistor of claim 7 wherein the first bandgap-smoothing transition region comprises $In_xGa_{1-x}As$ with x varying across the first bandgap-smoothing transition region from a low value of x near the collector region to a higher value of x near the base region.

11. The transistor of claim 10 wherein the low value of x is $x<0.1$ and the higher value of x is $0.1\leq x\leq0.4$.

12. The transistor of claim 7 wherein the first bandgap-smoothing transition region comprises a layer of compositionally-graded $In_xGa_{1-x}As_{1-y}N_y$ with x and y varying across the first bandgap-smoothing transition region from low values of x and y near the collector region to higher values of x and y near the base region.

13. The transistor of claim 12 wherein $x=0$ and $y=0$ near the collector region.

14. The transistor of claim 13 wherein $x\geq0.03$ and $y\geq0.01$ near the base region.

15. The transistor of claim 1 further including a second bandgap-smoothing transition region located between the base and emitter regions.

16. The transistor of claim 15 wherein the second bandgap-smoothing transition region further includes a delta-doped portion.

17. The transistor of claim 15 wherein the second bandgap-smoothing transition region comprises $Al_xGa_{1-x}As$ with x varying across the second bandgap-smoothing transition region from $x=0$ near the base region to $x\leq0.3$ near the emitter region.

18. The transistor of claim 1 wherein the emitter region comprises indium gallium phosphide (InGaP).

19. The transistor of claim 1 wherein the emitter region comprises gallium arsenide (GaAs).

20. The transistor of claim 1 wherein the emitter region comprises aluminum gallium arsenide (AlGaAs).

21. The transistor of claim 1 wherein the collector region comprises gallium arsenide (GaAs).

22. The transistor of claim 1 wherein the collector region comprises indium gallium arsenide nitride (InGaAsN).

23. The transistor of claim 1 further comprising a passivation layer overlying exposed portions of the collector, emitter and base regions of the transistor.

24. The transistor of claim 23 wherein the passivation layer comprises silicon oxynitride.

25. An NPN double-heterojunction bipolar transistor formed on a gallium arsenide (GaAs) substrate and comprising:
   (a) a plurality of semiconductor layers epitaxially grown on the substrate including:
      (i) a layer of GaAs with n-type doping forming a collector region of the transistor;
      (ii) a layer of indium gallium phosphide (InGaP) with n-type doping forming an emitter region of the transistor;
      (iii) a layer of indium gallium arsenide nitride (InGaAsN) with p-type doping forming a base region of the transistor, with the base region being sandwiched between the collector and emitter regions; and
   (b) electrodes forming separate electrical connections to each of the collector, emitter and base regions of the transistor.

26. The transistor of claim 25 wherein the layer of GaAs forming the collector region includes a first portion proximate to the base region with n-type doping in the range of $10^{15}$–$10^{16}$ cm$^{-3}$, and a second portion distal to the base region with n-type doping in the range of $10^{18}$–$10^{19}$ cm$^{-3}$.

27. The transistor of claim 25 wherein the layer of InGaP forming the emitter region is n-type doped in the range of $1\times10^{17}$ to $2\times10^{18}$ cm$^{-3}$.

28. The transistor of claim 27 wherein the layer of InGaP forming the emitter region further includes a delta-doped portion.

29. The transistor of claim 25 wherein the layer of InGaAsN forming the base region is p-type doped in the range of $10^{18}$ to $10^{20}$ cm$^{-3}$.

30. The transistor of claim 25 wherein the InGaAsN base region comprises
In$_x$Ga$_{1-x}$As$_{1-y}$N$_y$ with x and y being varied across the base region to provide a smaller value of y<0.01 near the emitter region and a larger value of $0.01 \leq y \leq 0.03$ near the collector region, thereby grading the composition of the base region.

31. The transistor of claim 25 wherein the InGaAsN layer forming the base region comprises In$_x$Ga$_{1-x}$As$_{1-y}$N$_y$ with 0<x−0.1 and with $0 < y \leq 0.03$.

32. The transistor of claim 31 wherein x=0.03 and y=0.01.

33. The transistor of claim 25 wherein the p-type doping of the InGaAsN base region varies in concentration across the base region with a higher level of the p-type-doping proximate to the emitter region, and with a lower level of the p-type doping proximate to the collector region.

34. The transistor of claim 25 further including a first bandgap-smoothing transition region located between the base and collector regions.

35. The transistor of claim 34 wherein the first bandgap-smoothing transition region further comprises a delta-doped portion.

36. The transistor of claim 34 wherein the first bandgap-smoothing transition region comprises a layer of indium gallium arsenide (InGaAs) epitaxially grown between the base and collector regions.

37. The transistor of claim 34 wherein the layer of InGaAs comprises In$_x$Ga$_{1-x}$As with x varying across the first bandgap-smoothing transition region from a low value of x near the collector to a higher value of x near the base region.

38. The transistor of claim 37 wherein the low value of x is x<0.1 and the higher value of x is $0.1 \leq x \leq 0.4$.

39. The transistor of claim 34 wherein the first bandgap-smoothing transition region comprises a layer of compositionally-graded In$_x$Ga$_{1-x}$As$_{1-y}$N$_y$ with x and y varying across the first bandgap-smoothing transition region from low values of x and y near the collector region to higher values of x and y near the base region.

40. The transistor of claim 39 wherein x=0 and y=0 near the collector region.

41. The transistor of claim 40 wherein $x \geq 0.03$ and $y \geq 0.01$ near the base region.

42. The transistor of claim 34 wherein the first bandgap-smoothing transition region is substantially strain-free.

43. The transistor of claim 34 further including a second bandgap-smoothing transition region located between the base and emitter regions.

44. The transistor of claim 43 wherein the second bandgap-smoothing transition region further includes a delta-doped portion.

45. The transistor of claim 43 wherein the second bandgap-smoothing transition region comprises Al$_x$Ga$_{1-x}$As with x varying across the second bandgap-smoothing transition region from x=0 near the base region to $x \leq 0.3$ near the emitter region.

46. The transistor of claim 25 further comprising a passivation layer overlying exposed portions of the collector, emitter and base regions of the transistor.

47. The transistor of claim 46 wherein the passivation layer comprises silicon oxynitride.

48. The transistor of claim 25 wherein the collector, emitter and base regions have a mesa structure.

49. The transistor of claim 25 wherein the GaAs substrate comprises a semi-insulating GaAs substrate.

50. An NPN double-heterojunction bipolar transistor formed on a gallium arsenide (GaAs) substrate and comprising:
(a) a plurality of semiconductor layers epitaxially grown on the substrate and patterned to form a mesa structure, with the semiconductor layers including:
(i) a layer of GaAs overlying the substrate with n-type doping to form a collector region of the transistor;
(ii) a bandgap-smoothing transition region comprising a layer of compositionally-graded indium gallium arsenide (InGaAs) or indium gallium arsenide nitride (InGaAsN) with n-type doping overlying the collector region;
iii) a layer of InGaAsN with p-type doping forming a base region of the transistor overlying the bandgap-smoothing transition region;
iv) a layer of indium gallium phosphide (InGaP) with n-type doping forming an emitter region of the transistor overlying the base region;
v) a layer of GaAs with n-type doping overlying the InGaP layer to form a super-emitter region; and
vi) a cap layer of InGaAs with n-type doping overlying the super-emitter region; and
(b) electrodes forming separate electrical connections to each of the collector, emitter and base regions of the transistor, with the electrical connection to the emitter region being formed above the cap layer.

51. The transistor of claim 50 wherein the GaAs substrate comprises a semi-insulating GaAs substrate.

52. The transistor of claim 50 wherein the bandgap-smoothing transition region further includes a delta-doped portion.

53. The transistor of claim 52 wherein the emitter region further includes a delta-doped portion.

54. The transistor of claim 50 further comprising a passivation layer covering exposed portions of the collector, emitter and base regions of the transistor.

55. The transistor of claim 54 wherein the passivation layer comprises silicon oxynitride.

* * * * *